July 7, 1970 P. J. HEIDENREICH 3,518,753
GLASS ENCAPSULATED SEMICONDUCTOR DEVICES
Filed Aug. 22, 1967
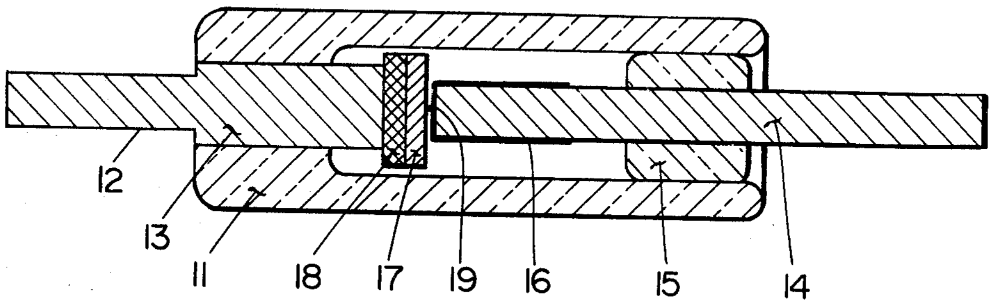
FIG. 1
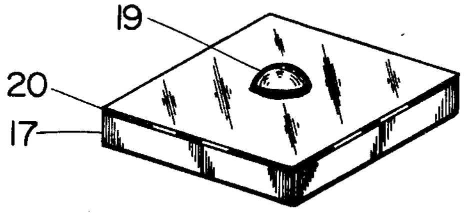
FIG. 2
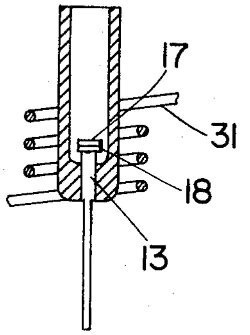
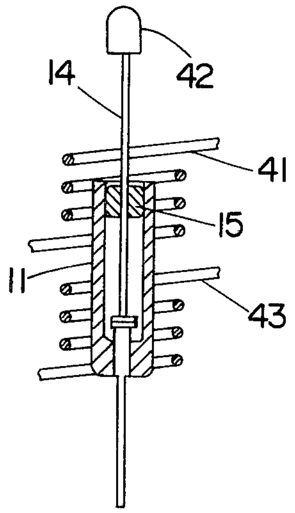
FIG. 3 FIG. 4
INVENTOR.
Paul J. Heidenreich
BY
Mueller, Aichele, & Rauner
Attys United States Patent Office 3,518,753

Patented July 7, 1970

3,518,753

GLASS ENCAPSULATED SEMICONDUCTOR DEVICES

Paul J. Heidenreich, Mesa, Ariz., assignor to Motorola, Inc., Franklin Park, Ill., a corporation of Illinois Filed Aug. 22, 1967, Ser. No. 662,336
Int. Cl. H01l 1/10
U.S. Cl. 29—588 3 Claims

ABSTRACT OF THE DISCLOSURE

A glass-encapsulated, small junction semiconductor diode is assembled by a procedure which involves "bump plating" the semiconductor die to provide a gold contact built up about one mil above the surrounding surface of the semiconductor die. The die is then bonded to the lead terminal within the tubular glass housing of a "first seal" subassembly. A gold plated, beaded lead subassembly is then inserted through the open end of the first seal subassembly whereby the gold plated end of the beaded lead comes to rest upon the gold bump of the semiconductor die. Finally, in a single heating step, a thermally induced pressure weld of the gold plated electrode to the gold bump is obtained, simultaneously with the fusing of the beaded lead to the glass housing of the first seal, to complete the packaged device.

BACKGROUND

This invention relates to the assembly of glass-encapsulated coaxial semiconductor devices, and is particularly concerned with mass production techniques for obtaining reliable electrode contacts in the assembly of small junction devices, such as hot carrier diodes and small junction tuning varactors.

In the assembly of glass packaged diodes it is a common practice to begin with the fabrication of a "first seal" subassembly comprised of a tubular glass housing open at one end, and having a first conductor lead hermetically sealed through the other end. Next, the semiconductor die is bonded to the lead terminal of the first seal subassembly. This may be accomplished by placing a low melting solder pellet, or alloy preform, between the lead terminal and the semiconductor die, then heating the combination whereby the alloy preform is fused, forming a metallurgical bond with the lead terminal, and with the semiconductor die.

A beaded lead subassembly is then prepared, comprised of a second conductor lead having an annular glass bead sealed thereon near one end, and which generally bears at the end thereof an elongated spring contact electrode for establishing pressure contact with the semiconductor die.

The beaded lead is then inserted in the open end of the first seal, with the spring contact means brought to rest upon the semiconductor die. With the beaded lead weighted to provide the proper pressure upon the spring contact means, sufficient heat is applied to fuse the glass bead with the open end of the tubular housing of the first seal, to complete the device.

Two serious problems have arisen with the pressure contact devices. First of all, the free end of the spring contact electrode is susceptible to a limited shift in the exact location at which it contacts the semiconductor die. For many purposes, even a slight shift in the position of contact cannot be tolerated since a significant change in the electrical characteristics of the device generally results. The second problem arises in connection with semiconductor structures characterized by very small junctions, e.g., 10 mils or less in diameter. Extreme precision is required when combining the first seal with the beaded lead, in order to ensure that the inserted lead is accurately located in contact with the electrode of the semiconductor die. The usual techniques have been found inadequate because of the high incidence of rejected devices resulting from a failure of the inserted lead to contact the corresponding electrode of the semiconductor die.

THE INVENTION

Accordingly, it is an object of the present invention to provide an improved glass-encapsulated semiconductor device, and to provide a method for its fabrication. It is a more particular object of the invention to provide a method for assembling a glass-encapsulated semiconductor device, involving an improved technique for ensuring accurate and reliable contact of a beaded lead terminal with the corresponding electrode of a small junction semiconductor die.

It is a further object of the invention to provide a method for the assembly of a glass-encapsulated semiconductor device, involving the formation of a thermally-induced pressure weld of the end of an inserted beaded lead to the corresponding electrode of a semiconductor die.

A primary feature of the glass packaged semiconductor device of the invention is the use of a bump-plated semiconductor die to obtain a reliable contact of the semiconductor electrode with the inserted straight-through beaded lead.

Another important feature of the invention is the pressure-welded contact of the beaded lead with the bump-plated die. In a particular embodiment the beaded lead is gold-plated prior to insertion in order to facilitate the formation of a pressure weld with the gold bump of the semiconductor die. The use of a pressure weld effectively eliminates shifting of the electrode contact location, thereby improving the reliability of the device.

The invention is embodied in a packaged semiconductor device comprising a glass member having a hermetically sealed chamber therein, first and second substantially axial conductor leads terminating within said chamber, and a semiconductor die within the chamber, mounted in ohmic contact with said first lead, the semiconductor die having an electrode welded to the second lead.

In a more limited embodiment, the semiconductor die of the invention includes a built-up electrode extending slightly above the surrounding surface of the die. Gold is the preferred material used in forming the raised or built-up electrode. The electrode is generally located in a central region of the die in order to facilitate its contact by the inserted tip of the beaded lead. The electrode may be formed by known procedures, such as by fusing a small gold sphere to the ohmic contact area of the die. Preferably, however, a gold-plating technique is employed.

The invention is further embodied in a device which includes the above elements in further combination with an alloy preform metallurigically bonded between the first lead of the device and the semiconductor die.

The invention is also embodied in a method for the assembly of a glass-encapsulated semiconductor device. Initially, a first seal subassembly is provided, or prepared, comprised of a tubular glass housing open at one end and bearing a first electrode sealed in and through the other end. A semiconductor die having a built-up electrode is then bonded to the lead terminal of the first seal, preferably by means of fusing a low-melting alloy preform between the die and the lead terminal. Thereafter, a beaded lead subassembly is inserted into the open end of the glass element of the first seal subassembly. The beaded lead is weighted to provide sufficient pressure to cause the formation of a pressure-welded contact with the built-up electrode of the semiconductor structure during the final step of applying heat and pressure to the parts. The beaded lead is thereby fused with the glass element of the first seal to form a hermetically sealed enclosure. The built-up electrode is pressure-welded to the end of the beaded lead in the same heating step.

In a preferred embodiment the built-up electrode of the semiconductor die is comprised of electroplated gold. The end of the beaded lead to be bonded therewith is also gold-plated, prior to its insertion into the open end of the glass element of the first seal subassembly.

An additional feature of the preferred embodiments of the invention is the procedure used for bump-plating the semiconductor structure to be assembled in accordance with the invention. First, a masking pattern is applied to the wafer, which leaves exposed only the areas to be gold-plated. The mask may be formed in accordance with known techniques including, for example, the use of Kodak Metal Etch Resist, frequently employed in the fabrication of semiconductor structures. The wafer is then connected as the cathode in an electro-plating cell filled with a gold-plating solution. Given a certain area, a (mils$^2$), to be bump-plated, a suitable current, X, may be determined in accordance with the following relationship:

$$X=(2.45\times10^{-4}\text{ milliamps/mil}^2)\times(A\text{ mils}^2)$$

Using this relationship, gold-plated electrodes extending 1 to 2 mils above the surrounding wafer surface are produced at the end of about 25 minutes plating time.

The above relationship is not critical and may be modified to achieve optimum results as desired, depending upon the particular circumstances of a given operation. In general, however, it has been found that an increase in the current density above that corresponding to the above relationship increases the area covered by the plated bump. Also, an increased bump height may be obtained by increasing the plating time.

DRAWINGS

FIG. 1 is an elevational view in cross section, showing the features of a completed device assembled in accordance with the invention.

FIG. 2 is a detailed perspective view of the semiconductor die to the lead terminal of the first seal subassembly.

FIG. 3 illustrates the step of bonding the semiconductor die to the lead terminal of the first seal subassembly.

FIG. 4 illustrates the final stage of assembly involving the fusion of the beaded lead to the glass housing of the first seal subassembly, and also including the formation of a thermally induced pressure weld of the beaded lead to the bump-plated electrode of the semiconductor die.

In FIG. 1 the embodiment shown is seen to consist of a first seal subassembly, a beaded lead, and a semiconductor die/alloy preform combination bonded to the lead terminal of the first seal. The first seal includes tubular housing 11, conductor lead 12, and stud 13 which is an extension of lead 12. Typically, the first seal is composed of a soft glass housing measuring ⅛ by ⅜ inch, and having a copper clad steel wire or rod lead, known as "Dumet," sealed in one end. The beaded lead includes conductor 14 surrounded by glass bead 15, and having a gold-plated tip 16. Semiconductor die 17 is bonded to stud 13 by means of fused alloy preform 18, composed of a tin-clad molybdenum disc, for example. Die 17 includes a bump-plated electrode 19 pressure welded to gold plated tip 16 of lead 14.

FIG. 2 shows in greater detail the bump-plated electrode 19 of die 17. The electrode extends through oxide layer 20, making ohmic contact with the semiconductor.

FIG. 3 illustrates the step of heating the first seal in combination with the semiconductor die 17 and alloy preform 18. A slight fusing of the preform by heat supplied from coil 31 is sufficient to form a metallurgical bond of the preform to stud 13 and die 17. Other examples of alloy preforms include a gold-tin and a lead-tin alloy, melting in the 220°–250° C. range.

FIG. 4 illustrates the final step of heating the first seal and the beaded lead with coil 41 to fuse bead 15 with tubular housing 11. At the same time, weight 42 is applied to lead 14 to form a pressure weld between tip 16 (FIG. 1) and bump-plated electrode 19, aided by heat from coil 43. The weight applied to lead 14 is generally in the range of 25–50 g., with the optimum weight depending primarily upon the area of electrode 19. It will be apparent that a larger area requires increased weight to achieve a satisfactory weld. A temperature of 800°–1000° C. is required to fuse bead 15 with housing 11. The pressure welding of tip 16 to electrode 19 does not require a high temperature, 400°–600° C. being generally satisfactory. Some remelting of preform 18 may occur during this step, but this has not caused any problem. The completed assembly is then removed and cooled.

I claim:

1. A method for the assembly of a glass encapsulated semiconductor device comprising the steps of:
(a) providing a "first seal" subassembly comprised of a tubular glass housing open at one end and including a first electrode sealed in and through the other end thereof,
(b) bonding a semiconductor die having a built-up electrode to the lead terminal of said first seal subassembly by means of fusing an alloy preform between the terminal and the die,
(c) inserting a beaded lead into the open end of the glass element of said subassembly, in contact with the built-up electrode of said semiconductor die, and
(d) applying heat and pressure to the combination while pressing said beaded lead against the built-up electrode of said semiconductor die, whereby said beaded lead is fused with the glass element of said first seal subassembly, and whereby a thermally induced pressure weld is formed between the end of the beaded lead and the built-up electrode.

2. A method for the assembly of a glass encapsulated semiconductor device comprising the steps of:
(a) providing a "first seal" subassembly comprised of a tubular glass housing open at one end and including a first electrode sealed in and through the other end thereof,
(b) bonding a semiconductor die having a built-up electroplated electrode comprised of gold to the lead terminal of said first seal subassembly,
(c) inserting a beaded lead into the open end of the glass element of said subassembly, in contact with the built-up electrode of said semiconductor die, and
(d) applying heat and pressure to the combination while pressing said beaded lead against the built-up electrode of said semiconductor die, whereby said beaded lead is fused with the glass element of said first seal subassembly, and whereby a thermally induced pressure weld is formed between the end of the beaded lead and the built-up electrode.

3. A method for the assembly of a glass encapsulated semiconductor device comprising the steps of:
(a) providing a "first seal" subassembly comprised of a tubular glass housing open at one end and including a first electrode sealed in and through the other end thereof,
(b) bonding a semiconductor die having a built-up electrode to the lead terminal of said first seal subassembly,
(c) gold-plating the end of a beaded lead,
(d) inserting said gold plated end of said beaded lead into the open end of the glass element of said subassembly, in contact with the built-up electrode of said semiconductor die, and (e) applying heat and pressure to the combination while pressing said beaded lead against the built-up electrode of said semiconductor die, whereby said beaded lead is fused with the glass element of said first seal subassembly, and whereby a thermally induced pressure weld is formed between said gold plated end of the beaded lead and the built-up electrode.

References Cited

UNITED STATES PATENTS

| | | | |
|---|---|---|---|
| 2,893,185 | 7/1959 | Warren et al. | 29—588 X |
| 3,142,886 | 8/1964 | Bronson et al. | 29—570 X |
| 3,178,796 | 4/1965 | Smits | 29—27.9 |
| 3,210,623 | 10/1965 | Sato et al. | 29—588 |

PAUL M. COHEN, Primary Examiner

U.S. Cl. X.R.

29—587, 472.9